US 6,567,444 B2

(12) United States Patent
Hayakawa

(10) Patent No.: US 6,567,444 B2
(45) Date of Patent: May 20, 2003

(54) HIGH-POWER SEMICONDUCTOR LASER DEVICE IN WHICH NEAR-EDGE PORTIONS OF ACTIVE LAYER ARE REMOVED

(75) Inventor: Toshiro Hayakawa, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/820,357

(22) Filed: Mar. 29, 2001

(65) Prior Publication Data

US 2001/0026571 A1 Oct. 4, 2001

(30) Foreign Application Priority Data

Mar. 29, 2000 (JP) ........................................ 2000-091435

(51) Int. Cl.[7] ............................................... H01S 5/00
(52) U.S. Cl. ............................... 372/45; 372/46; 372/50
(58) Field of Search ......................... 372/46, 50; 437/129

(56) References Cited

U.S. PATENT DOCUMENTS

| 5,020,068 A | * | 5/1991 | Isshiki .......................... 372/46 |
| 5,242,856 A | * | 9/1993 | Kurihara et al. ............. 437/129 |
| 5,574,743 A | * | 11/1996 | Van der poel et al. ........ 372/46 |
| 5,581,571 A | * | 12/1996 | Holonyak, Jr. et al. ....... 372/46 |
| 5,859,866 A | * | 1/1999 | Forest et al. .................. 372/50 |

FOREIGN PATENT DOCUMENTS

JP    11-348527    12/1999

OTHER PUBLICATIONS

Applied Physics Letters, vol. 72, No. 1, 1998, p. 4.
Japanese Journal of Applied Physics, vol. 34, 1995, L1175.
Electronics Letters, vol. 34, No. 2, 1998, p. 184.
Applied Physics Letters, vol. 75, No. 13, 1999, p. 1839.

* cited by examiner

Primary Examiner—Paul Ip
Assistant Examiner—Tuan Nguyen
(74) Attorney, Agent, or Firm—Sughrue Mion, PLLC

(57) ABSTRACT

In a semiconductor laser device, an active region, including a quantum well layer sandwiched between upper and lower optical waveguide layers, is formed on a substrate. A near-edge portion of the active region is etched down to a mid-thickness of the lower optical waveguide layer. A non-absorbing layer, made of a semiconductor material having a bandgap greater than photon energy of laser light generated in the active region, is formed over the active region. An etching stop layer is formed at the mid-thickness location in the lower optical waveguide layer so as to selectively stop the etching of the near-edge portion of the active region. An electron barrier layer, made of a semiconductor material having a bandgap greater than the bandgap of the upper optical waveguide layer, is formed at a mid-thickness location in the upper optical waveguide layer.

3 Claims, 6 Drawing Sheets

C-C' CROSS SECTION

A-A' CROSS SECTION

B-B' CROSS SECTION

A-A' CROSS SECTION

B-B' CROSS SECTION

A-A' CROSS SECTION

B-B' CROSS SECTION

HIGH-POWER SEMICONDUCTOR LASER DEVICE IN WHICH NEAR-EDGE PORTIONS OF ACTIVE LAYER ARE REMOVED

BACKGROUND OF THE INVENTION

1. Field of the Invention

The present invention relates to a semiconductor laser device having an end-facet window structure, i.e., a structure which makes an end facet nonabsorbent of oscillation light.

2. Description of the Related Art

J. K. Wade et al. ("6.1 W continuous wave front-facet power from Al-free active-region ($\lambda$=805 nm) diode lasers," Applied Physics Letters, vol. 72, No. 1 (1998) pp.4–6) disclose a semiconductor laser device which emits light in the 805 nm band. The semiconductor laser device comprises an Al-free InGaAsP active layer, an InGaP optical waveguide layer, and InAlGaP cladding layers. In addition, in order to improve the characteristics in the high output power range, the semiconductor laser device includes a so-called large optical cavity (LOC) structure in which the thickness of the optical waveguide layer is increased so as to reduce the light density, and increase the maximum light output power. However, when the optical power is maximized, currents generated by optical absorption in the vicinity of end facets generate heat, i.e., raise the temperature at the end facets. In addition, the raised temperature reduces the bandgap at the end facets, and therefore the optical absorption is further enhanced to damage the end facet. That is, a vicious cycle is formed. This damage is the so-called catastrophic optical mirror damage (COMD). When the optical power reaches the COMD level, the optical output deteriorates with time. Further, the semiconductor laser device is likely to suddenly break down due to the COMD. Therefore, the above semiconductor laser device is not reliable when the semiconductor laser device operates with high output power.

In addition, T. Fukunaga et al. ("Highly Reliable Operation of High-Power InGaAsP/In$_{0.48}$Ga$_{0.52}$P/AlGaAs 0.8 $\mu$m Separate Confinement Heterostructure Lasers," Japanese Journal of Applied Physics, vol. 34 (1995) L1175–L1177) disclose a semiconductor laser device which comprises an Al-free active layer, and emits light in the 0.8 $\mu$m band. In the semiconductor laser device, an n-type AlGaAs cladding layer, an intrinsic (i-type) InGaP optical waveguide layer, an InGaAsP quantum well active layer, an i-type InGaP optical waveguide layer, a p-type AlGaAs cladding layer, and a p-type GaAs cap layer are formed on an n-type GaAs substrate. S. O'Brien, H. Zhao, and R. J. Lang report, in Electronics Letters, vol. 34, No. 2 (1998) p.184, that the maximum output power of the above semiconductor laser device disclosed by Fukunaga et al, is 1.8 W. They also report the maximum breakdown light output power of multiple-transverse-mode semiconductor laser devices having a stripe width of 50 micrometers or greater. For example, at the wavelength of 0.87 micrometers, the maximum breakdown light output power of a multiple-transverse-mode semiconductor laser device having a stripe width of 100 micrometers is reported to be 1.3 W, and the maximum breakdown light output power of a multiple-transverse-mode semiconductor laser device having a stripe width of 200 micrometers is reported to be 16.5 W.

Further, the present inventor, T. Hayakawa, and others report, in Applied Physics Letters, Vol. 75, No. 13 (1999) p. 1839, that the practical light output power of 1.5 W is achieved in continuous oscillation of a semiconductor laser device having a stripe width of 50 micrometers when the semiconductor laser device is designed to increase the beam width in the direction perpendicular to the active layer, lower the peak optical strength, and minimize the temperature raise at a light-exit end facet. However, it is difficult to increase the reliability and the practical light output power of the semiconductor laser device by a large amount.

In order to solve the above problems, the Japanese Patent Application No. 11(1999)-348527 and the copending U.S. patent application Ser. No. 09/731,702, "HIGH-POWER SEMICONDUCTOR LASER DEVICE IN WHICH NEAR-EDGE PORTIONS OF ACTIVE LAYER ARE REMOVED", corresponding to the Japanese patent application and being filed on Dec. 8, 2000 by Toshiaki Fukunaga and assigned to the same assignee as the present patent application, disclose a semiconductor laser device in which transparent regions are formed in vicinities of end facets with Al-free material. However, the transparent regions are required to be formed by crystal regrowth, and the crystal regrowth is initiated from a surface of an optical waveguide layer located near to the quantum well active layer. That is, portions of the regrowth boundary are near the quantum well. In addition, there is no energy barrier between the quantum well active layer and the other portions of the regrowth boundary. In the semiconductor laser device formed as above, carriers leaked from the active layer and diffused to the regrowth boundary cause non-radiative recombination at the regrowth boundary. Therefore, the efficiency of the semiconductor laser device decreases, and degradation is promoted. Further, before the regrowth, the regions in the vicinities of the end facets must be etched to the depth of a crystal layer which is located immediately below the active layer. Therefore, it is not easy to control the depth of the etching.

SUMMARY OF THE INVENTION

The object of the present invention is to provide a semiconductor laser device in which regions in vicinities of end facets are made of a material being non-absorbent of oscillation light so that non-radiative recombination at a regrowth boundary is prevented, and the reliability and performance of the semiconductor laser device are improved.

According to the present invention, there is provided a semiconductor laser device comprising a substrate, an active region formed above the substrate, and a non-absorbing layer formed over the active region, and made of a semiconductor material having a bandgap greater than the photon energy of laser light which oscillates in the semiconductor laser device. The active region includes a first lower optical waveguide layer formed above the substrate, an etching stop layer formed on the first lower optical waveguide layer except for near-edge areas of the first lower optical waveguide layer, a second lower optical waveguide layer formed on the etching stop layer, a quantum well active layer formed on the second lower optical waveguide layer, a first upper optical waveguide layer formed on the quantum well active layer, an electron barrier layer formed on the first upper optical waveguide layer and made of a semiconductor material having a bandgap greater than a bandgap of the first upper optical waveguide layer, and a second upper optical waveguide layer formed on the electron barrier layer, where the near-edge areas are located adjacent to opposite end facets which are perpendicular to the direction of the laser light. The etching stop layer has such a chemical property that the etching stop layer can be maintained when the second lower optical waveguide layer, the quantum well active layer, the first upper optical waveguide layer, and the electron barrier layer are etched, and the first lower optical waveguide layer can be maintained when the etching stop layer is etched.

When the semiconductor laser device according to the present invention is produced, first, a first lower optical waveguide layer, an etching stop layer, a second lower optical waveguide layer, a quantum well active layer, a first upper optical waveguide layer, an electron barrier layer, and a second upper optical waveguide layer are formed above the substrate in this order. Next, near-edge portions (i.e., portions in vicinities of end facets which are perpendicular to the light axis) of the second lower optical waveguide layer, the quantum well active layer, the first upper optical waveguide layer, the electron barrier layer, and the second upper optical waveguide layer are removed by selective etching. Then, near-edge portions of the etching stop layer are also removed by selective etching. The etching stop layer has such a chemical property that the etching stop layer can be maintained when the second lower optical waveguide layer, the quantum well active layer, the first upper optical waveguide layer, the electron barrier layer, and the second upper optical waveguide layer are etched, and the first lower optical waveguide layer can be maintained when the etching stop layer is etched. Therefore, the etching of the above near-edge portions can be stopped at the upper surface of the first lower optical waveguide layer with high accuracy. Thereafter, a non-absorbing layer, which is made of a semiconductor material having a bandgap greater than the photon energy of laser light which oscillates in the semiconductor laser device, is formed over the active region. Since the upper surface of the first lower optical waveguide layer which is apart from the quantum well active layer is a regrowth boundary, carriers leaked and diffused from the quantum well active layer do not cause non-radiative recombination at the regrowth boundary. Therefore, it is possible to prevent the decrease in the efficiency due to the non-radiative recombination and the degradation of the end facet due to heat generation. Thus, the performance and reliability of the semiconductor laser device can be improved.

In addition, since the electron barrier layer is formed between the first and second upper optical waveguide layers, and made of a semiconductor material having a bandgap greater than the bandgap of the first upper optical waveguide layer, it is possible to prevent leakage of carriers from the active layer to a regrowth boundary located above the second upper optical waveguide layer. Therefore, at the regrowth boundary, no non-radiative recombination is caused by the carriers leaked from the active layer. Thus, the decrease in the efficiency due to the non-radiative recombination and the degradation of the end facet due to heat generation can be prevented.

Preferably, the semiconductor laser device according to the present invention may also have one or any possible combination of the following additional features (i) and (ii).

(i) The quantum well active layer may be made of an aluminum-free semiconductor material. It is well known that when an active layer does not contain aluminum, composition change due to oxidation of aluminum can be prevented, and the reliability of the semiconductor laser device can be increased. However, in particular, when the quantum well active layer in the semiconductor laser device according to the present invention is made of an aluminum-free semiconductor material, the reliability of the semiconductor laser device can be remarkably increased.

(ii) The non-absorbing layer and a semiconductor layer immediately under the non-absorbing layer may be made of an aluminum-free semiconductor material. In this case, both of the regrown layer and the base layer of the regrowth are aluminum-free. Therefore, the reliability of the semiconductor laser device can be remarkably increased.

DESCRIPTION OF PREFERRED EMBODIMENTS

Embodiments of the present invention are explained in detail below with reference to drawings.

First Embodiment

Figure 1A:
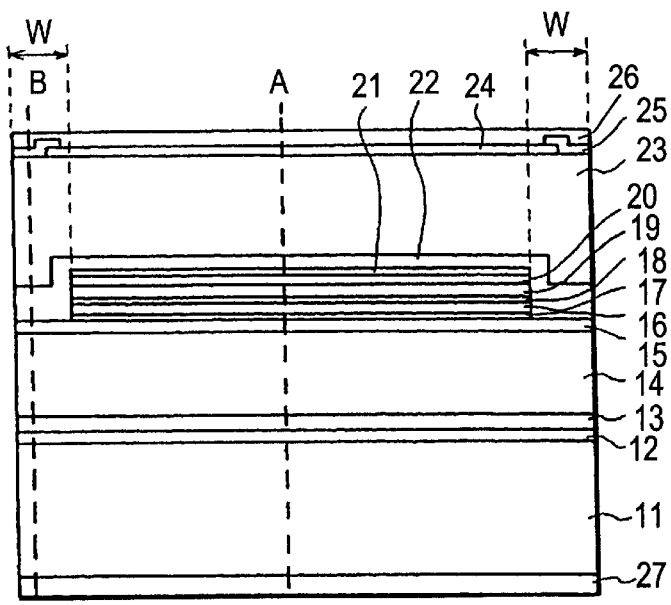
FIGS. 1A, 1B and 1C are cross-sectional views of a semiconductor laser device as the first embodiment of the present invention.
Figure 1B:
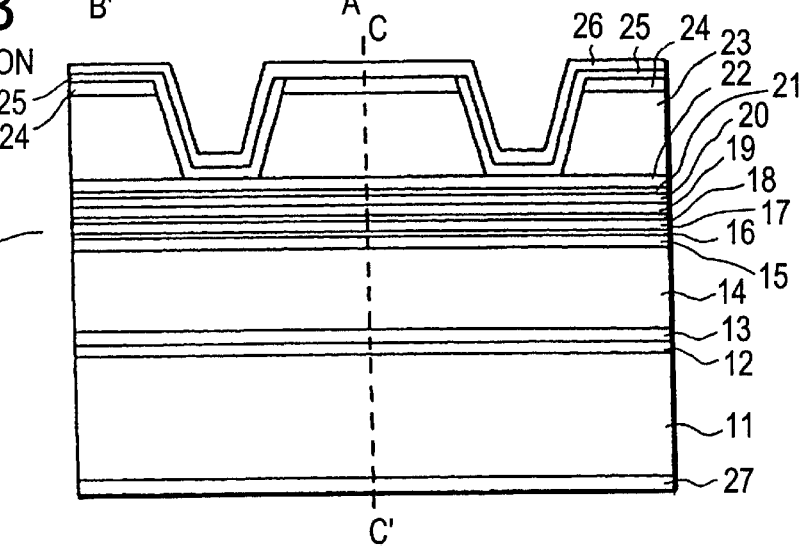
Figure 1C:
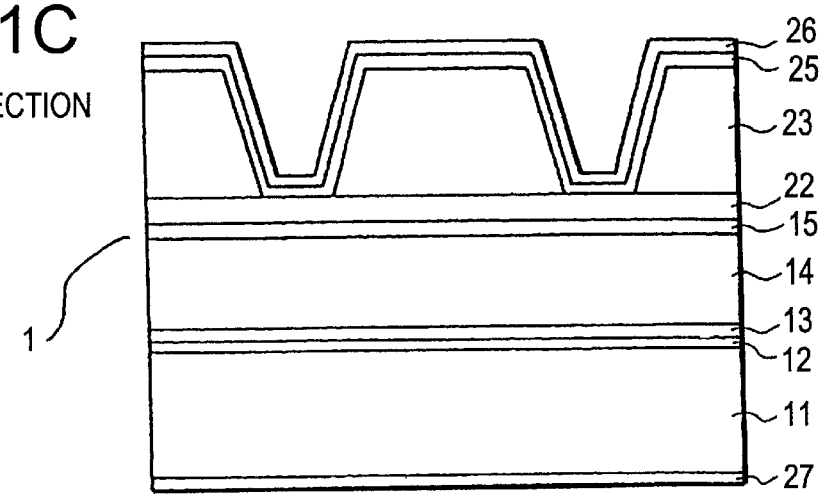

The construction of a semiconductor laser device 1 as the first embodiment of the present invention and a process of producing the construction are explained below with reference to FIGS. 1A to 1C, which are cross-sectional views of the semiconductor laser device 1 as the first embodiment. FIG. 1A is a first cross-sectional view illustrating a first cross section (the C–C' cross section indicated in FIG. 1B) parallel to a resonator axis of the semiconductor laser device 1, FIG. 1B is a second cross-sectional view illustrating a second cross section (the A–A' cross section indicated in FIG. 1A), and FIG. 1C is a third cross-sectional view illustrating a third cross section (the B–B' cross section indicated in FIG. 1A).

As illustrated in FIG. 1A, the right and left ends are cleaved mirror surfaces (end facets). In the first MOCVD (metal organic chemical vapor deposition) stage, an n-type GaAs buffer layer 12 being doped with $5 \times 10^{17}$ cm$^{-3}$ Si and having a thickness of 0.5 micrometers, an n-type $Al_xGa_{1-x}As$ graded buffer layer 13 being doped with $5 \times 10^{17}$ cm$^{-3}$ Si and having a thickness of 0.2 micrometers (where x gradually increases from 0.1 to 0.63), an n-type $Al_{0.63}Ga_{0.37}As$ lower cladding layer 14 being doped with $5 \times 10^{17}$ cm$^{-3}$ Si and having a thickness of 1.5 micrometers, an n-type $In_{0.48}Ga_{0.52}P$ first lower optical waveguide layer 15 being doped with $5 \times 10^{17}$ cm$^{-3}$ Si and having a thickness of 0.4 micrometers, an undoped AlGaAs etching stop layer 16 having a thickness of 20 nm, an undoped $In_{0.48}Ga_{0.52}P$ second lower optical waveguide layer 17 having a thickness of 0.1 micrometers, an undoped $In_{0.13}Ga_{0.87}As_{0.75}P_{0.25}$ quantum well layer 18 having a thickness of 10 nm, an undoped $In_{0.48}Ga_{0.52}P$ first upper optical waveguide layer 19 having a thickness of 0.1 micrometers, an undoped AlGaAs electron barrier layer 20 having a thickness of 20 nm, a p-type $In_{0.48}Ga_{0.52}P$ second upper optical waveguide layer 21 being doped with $7 \times 10^{17}$ cm$^{-3}$ Zn and having a thickness of 0.05 micrometers are formed in this order by reduced-pressure MOCVD on an n-type GaAs substrate 11 which is doped with $2 \times 10^{18}$ cm$^{-3}$ Si.

Next, near-edge portions W (i.e., portions in vicinities of end facets) of the above layered structure are removed by photolithography and chemical etching, as explained below. The width of the near-edge portions W is 25 micrometers. Since, in practice, the above layered structure is formed on a wafer for concurrently producing a plurality of semiconductor laser devices, stripe regions each having a width of 50 micrometers and straddling a boundary between the semiconductor laser devices are removed from the layered structure on the wafer. First, stripe areas of the p-type $In_{0.48}Ga_{0.52}P$ second upper optical waveguide layer 21 are etched off with HCl, and stripe areas of the undoped AlGaAs electron barrier layer 20 are etched off with a mixed solution of $H_2SO_4$, $H_2O_2$, and $H_2O$. Next, stripe areas of the undoped $In_{0.48}Ga_{0.52}P$ first upper optical waveguide layer 19 are etched off with HCl, stripe areas of the undoped $In_{0.13}Ga_{0.87}As_{0.75}P_{0.25}$ quantum well layer 18 are etched off with a mixed solution of $H_2SO_4$, $H_2O_2$, and $H_2O$, and stripe areas of the undoped $In_{0.48}Ga_{0.52}P$ second lower optical waveguide layer 17 are etched off with HCl. Then, the remaining resist and the like are removed, and the wafer is washed. Finally, stripe areas of the undoped AlGaAs etching stop layer 16 are etched off with a mixed solution of $H_2SO_4$, $H_2O_2$, and $H_2O$. Since the n-type $In_{0.48}Ga_{0.52}P$ first lower optical waveguide layer 15 exposed by the removal of the stripe areas of the undoped AlGaAs etching stop layer 16 are not etched, the exposed surfaces of the stripe areas of the n-type $In_{0.48}Ga_{0.52}P$ first lower optical waveguide layer 15 are cleaned by the washing process after the etching.

Thereafter, in the second MOCVD stage, a p-type $In_{0.48}Ga_{0.52}P$ third upper optical waveguide layer 22 being doped with $7\times10^{17}$ cm$^{-3}$ Zn and having a thickness of 0.35 micrometers, a p-type $Al_{0.63}Ga_{0.37}As$ upper cladding layer 23 being doped with $7\times10^{17}$ cm$^{-3}$ Zn and having a thickness of 2 micrometers, and a p-type GaAs cap layer 24 being doped with $2\times10^{19}$ cm$^{-3}$ Zn and having a thickness of 0.1 micrometers are formed in this order. Then, near-edge portions of the p-type GaAs cap layer 24 are selectively removed by etching with a mixed solution of $NH_4OH$ and $H_2O_2$, as illustrated in FIG. 1A. As illustrated in FIG. 1C, the p-type GaAs cap layer 24 does not appear on the end facet.

Next, a pair of stripe grooves each having a width of 10 micrometers are formed in the p-type GaAs cap layer 24 and the p-type $Al_{0.63}Ga_{0.37}As$ upper cladding layer 23 by photolithography and chemical etching with a mixed solution of $H_2SO_4$, $H_2O_2$, and $H_2O$ so that a ridge stripe structure having a width of 50 micrometers is formed between the pair of stripe grooves as illustrated in FIG. 1B. Due to the use of the mixed solution of $H_2SO_4$, $H_2O_2$, and $H_2O$, the etching automatically stops just above the p-type $In_{0.48}Ga_{0.52}P$ third upper optical waveguide layer 22. Then, a $SiO_2$ insulation film 25 is formed on the above layered structure by plasma CVD, and then a portion of the $SiO_2$ insulation film 25 on the top surface of the ridge stripe structure, except for the near-edge portions under which the p-type GaAs cap layer 24 is removed, is removed by using diluted HF.

Thereafter, a (Ti/Pt/Ti/Pt/Au) p electrode 26 is formed by evaporation and heat treatment, and the bottom surface of the n-type GaAs substrate 11 is polished until the total thickness of the layered structure becomes about 100 micrometers. Then, an (AuGe/Ni/Au) n electrode 27 is formed by evaporation and heat treatment.

Next, a laser bar having a length of about 1 cm and a resonator length of 1.5 mm is cut out from the wafer formed as above by scribing with a diamond needle and cleaving, and optical coatings are provided on the light-exit end facet and the opposite end facet so that the light-exit end facet has a reflectance of 8%, and the opposite end facet has a reflectance of 95%. Then, discrete laser chips having a width of about 500 micrometers are cut out by scribing with a diamond needle and cleaving. Finally, the p-electrode side of each laser chip is bonded to a copper heatsink with indium solder having a thickness of 4 to 5 micrometers, and the performance of the semiconductor laser device is evaluated. The semiconductor laser device is oscillated at the wavelength of about 809 nm above a threshold current of about 120 mA at room temperature. As a result, no kink is observed in the current-light output characteristic, and it is found that the semiconductor laser device as the first embodiment of the present invention can operate with high output power of 5 W or higher.

In the semiconductor laser device as the first embodiment of the present invention, the Al composition of the undoped AlGaAs electron barrier layer 20 can be determined to be in such a range that the energy gap of the undoped AlGaAs electron barrier layer 20 is greater than the energy gaps of the undoped $In_{0.48}Ga_{0.52}P$ first upper optical waveguide layer 19 and the p-type $In_{0.48}Ga_{0.52}P$ second upper optical waveguide layer 21.

In addition, the Al composition of the undoped AlGaAs etching stop layer 16 may be identical to the Al composition of the undoped AlGaAs electron barrier layer 20.

Further, the selective, chemical etching of each of the n-type $In_{0.48}Ga_{0.52}P$ first lower optical waveguide layer 15, the undoped AlGaAs etching stop layer 16, and the undoped $In_{0.48}Ga_{0.52}P$ second lower optical waveguide layer 17 is possible regardless of the Al composition of the undoped AlGaAs etching stop layer 16. In this regard, the composition of the undoped AlGaAs etching stop layer 16 can be expressed as $Al_vGa_{1-v}As$ ($0 \leq v \leq 1$).

Since, in the first embodiment, the undoped AlGaAs etching stop layer 16 is arranged between the n-type $In_{0.48}Ga_{0.52}P$ first lower optical waveguide layer 15 and the undoped $In_{0.48}Ga_{0.52}P$ second lower optical waveguide layer 17, which realize a lower optical waveguide layer, the controllability of the etching is very high. Therefore, the n-type $In_{0.48}Ga_{0.52}P$ first lower optical waveguide layer 15, which is apart from the quantum well layer, can be the base of the regrowth. Thus, the semiconductor laser device as the first embodiment is free from the influence of the non-radiative recombination caused by electrons leaked from the active layer. For example, the semiconductor laser device as the first embodiment is less prone to the efficiency reduction, degradation, and the like. That is, the performance and reliability are improved.

Furthermore, since the undoped AlGaAs electron barrier layer 20 is formed between the undoped $In_{0.48}Ga_{0.52}P$ first upper optical waveguide layer 19 and the p-type $In_{0.48}Ga_{0.52}P$ second upper optical waveguide layer 21, which realize an upper optical waveguide layer, the leakage electrons which reach the regrowth boundary (i.e., the boundary between the p-type $In_{0.48}Ga_{0.52}P$ second upper optical waveguide layer 21 and the p-type $In_{0.48}Ga_{0.52}P$ third upper optical waveguide layer 22) can be reduced.

Second Embodiment

Figure 2:
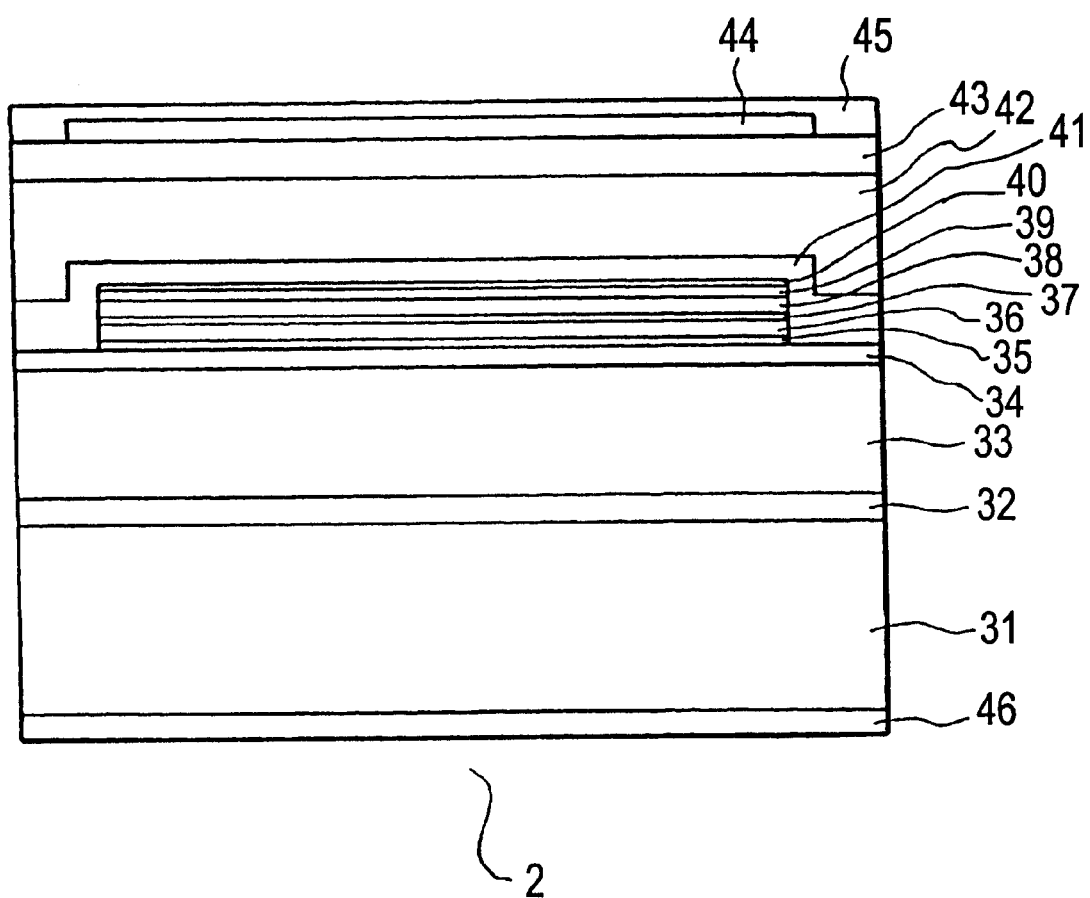
FIG. 2 is a cross-sectional view of a semiconductor laser device as the second embodiment of the present invention.

The construction of a semiconductor laser device 2 as the second embodiment of the present invention and a process of producing the construction are explained below with reference to FIG. 2, which is a cross-sectional view of the semiconductor laser device 2 as the second embodiment. FIG. 2 is a cross-sectional view illustrating a cross section parallel to a resonator axis of the semiconductor laser device. The semiconductor laser device as the second embodiment has a full-face-electrode structure.

As illustrated in FIG. 2, in the first MOCVD stage, an n-type GaAs buffer layer 32 being doped with $5 \times 10^{17}$ cm$^{-3}$ Si and having a thickness of 0.5 micrometers, an n-type $In_{0.48}(Ga_{0.5}Al_{0.5})_{0.52}P$ lower cladding layer 33 being doped with $5 \times 10^{17}$ cm$^{-3}$ Si and having a thickness of 1.5 micrometers, an n-type $In_{0.48}Ga_{0.52}P$ first lower optical waveguide layer 34 being doped with $5 \times 10^{17}$ cm$^{-3}$ Si and having a thickness of 0.3 micrometers, an undoped AlGaAs etching stop layer 35 having a thickness of 20 nm, an undoped $In_{0.48}Ga_{0.52}P$ second lower optical waveguide layer 36 having a thickness of 0.1 micrometers, an undoped $In_{0.13}Ga_{0.87}As_{0.75}P_{0.25}$ quantum well layer 37 having a thickness of 10 nm, an undoped $In_{0.48}Ga_{0.52}P$ first upper optical waveguide layer 38 having a thickness of 0.1 micrometers, an undoped AlGaAs electron barrier layer 39 having a thickness of 20 nm, a p-type $In_{0.48}Ga_{0.52}P$ second upper optical waveguide layer 40 being doped with $7 \times 10^{17}$ cm$^{-3}$ Zn and having a thickness of 0.05 micrometers are formed in this order by MOCVD on an n-type GaAs substrate 31 which is doped with $2 \times 10^{18}$ cm$^{-3}$ Si.

Next, near-edge portions (i.e., portions in vicinities of end facets) of the above layered structure are removed by photolithography and chemical etching, as explained below. First, stripe areas of the p-type $In_{0.48}Ga_{0.52}P$ second upper optical waveguide layer 40 are etched off with HCl, and stripe areas of the undoped AlGaAs electron barrier layer 39 are etched off with a mixed solution of $H_2SO_4$, $H_2O_2$, and $H_2O$. Next, stripe areas of the undoped $In_{0.48}Ga_{0.52}P$ first upper optical waveguide layer 38 are etched off with HCl, stripe areas of the undoped $In_{0.13}Ga_{0.87}As_{0.75}P_{0.25}$ quantum well layer 37 are etched off with a mixed solution of $H_2SO_4$, $H_2O_2$, and $H_2O$, and stripe areas of the undoped $In_{0.48}Ga_{0.52}P$ second lower optical waveguide layer 36 are etched off with HCl. Then, the remaining resist and the like are removed, and the wafer is washed. Finally, stripe areas of the undoped AlGaAs etching stop layer 35 are etched off with a mixed solution of $H_2SO_4$, $H_2O_2$, and $H_2O$.

Thereafter, in the second MOCVD stage, a p-type InGaAsP third upper optical waveguide layer 41 being doped with $7 \times 10^{17}$ cm$^{-3}$ Zn and having a thickness of 0.3 micrometers, a p-type $In_{0.48}(Ga_{0.5}Al_{0.5})_{0.52}P$ upper cladding layer 42 being doped with $7 \times 10^{17}$ cm$^{-3}$ Zn and having a thickness of 2 micrometers, a p-type $In_{0.48}Ga_{0.52}P$ layer 43 being doped with $7 \times 10^{17}$ cm$^{-3}$ Zn and having a thickness of 0.1 micrometers, and a p-type GaAs cap layer 44 being doped with $2 \times 10^{19}$ cm$^{-3}$ Zn and having a thickness of 0.1 micrometers are formed in this order.

Next, near-edge portions of the p-type GaAs cap layer 44 are selectively removed by etching with a mixed solution of $NH_4OH$ and $H_2O_2$, as illustrated in FIG. 2. Thereafter, a (Ti/Pt/Au) p electrode 45 is formed by evaporation and heat treatment, and the bottom surface of the n-type GaAs substrate 31 is polished until the total thickness of the layered structure becomes about 100 micrometers. Then, an (AuGe/Ni/Au) n electrode 46 is formed by evaporation and heat treatment.

Finally, laser bars are cut out, end facets are coated, and laser chips are cut out. Thus, the semiconductor laser device as the second embodiment is completed. The semiconductor laser device as the second embodiment oscillates at the wavelength of 809 nm.

Third Embodiment

Figure 3:
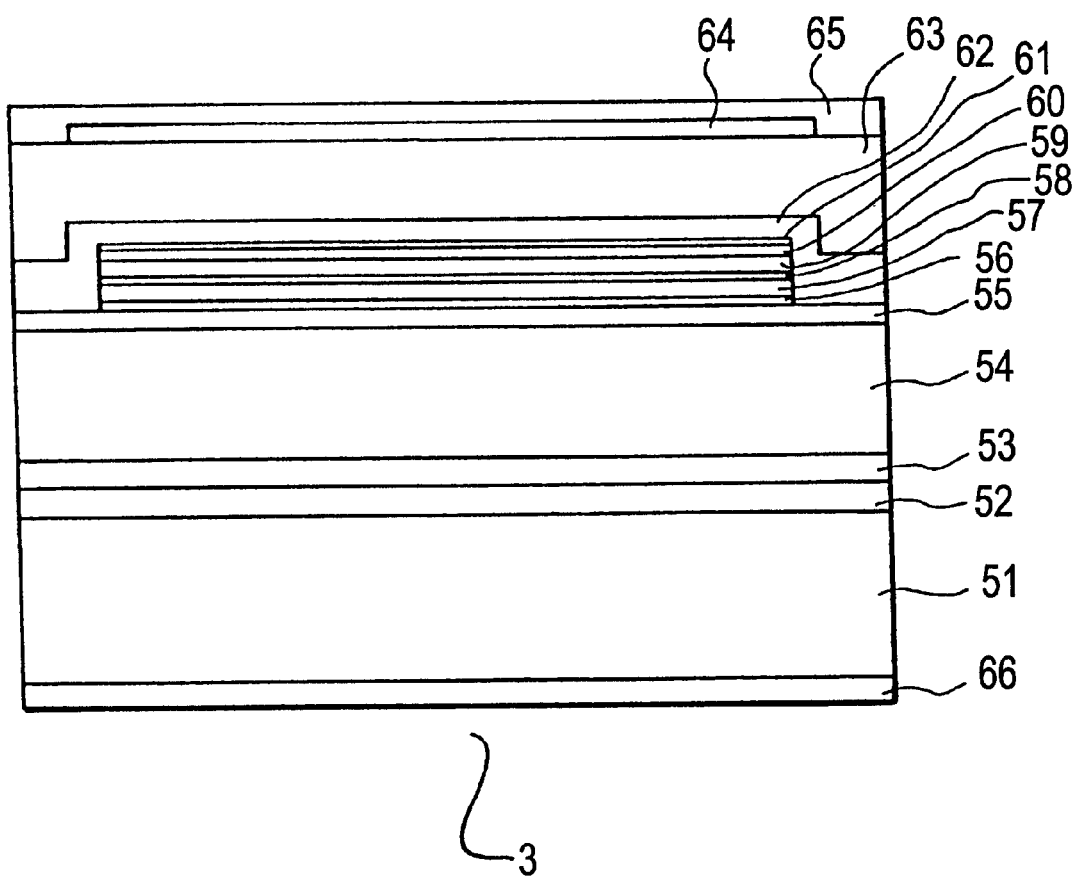
FIG. 3 is a cross-sectional view of a semiconductor laser device as the third embodiment of the present invention.

The construction of a semiconductor laser device 3 as the third embodiment of the present invention and a process of producing the construction are explained below with reference to FIG. 3, which is a cross-sectional view of the semiconductor laser device 3 as the third embodiment. FIG. 3 is a cross-sectional view illustrating a cross section parallel to a resonator axis of the semiconductor laser device. The semiconductor laser device as the third embodiment also has a full-face-electrode structure.

As illustrated in FIG. 3, in the first MOCVD stage, an n-type GaAs buffer layer 52 being doped with $5 \times 10^{17}$ cm$^{-3}$ Si and having a thickness of 0.5 micrometers, an n-type $Al_xGa_{1-x}As$ graded buffer layer 53 being doped with $5 \times 10^{17}$ cm$^{-3}$ Si and having a thickness of 0.2 micrometers (where x gradually increases from 0.1 to 0.5), an n-type $Al_{0.5}Ga_{0.5}As$ lower cladding layer 54 being doped with $5 \times 10^{17}$ cm$^{-3}$ Si and having a thickness of 1.5 micrometers, an n-type $In_{0.13}Ga_{0.87}As_{0.75}P_{0.25}$ first lower optical waveguide layer 55 being doped with $5 \times 10^{17}$ cm$^{-3}$ Si and having a thickness of 0.4 micrometers, an undoped $In_{0.48}Ga_{0.52}P$ etching stop layer 56 having a thickness of 20 nm, an undoped $In_{0.13}Ga_{0.87}As_{0.75}P_{0.25}$ second lower optical waveguide layer 57 having a thickness of 0.1 micrometers, an undoped $In_{0.16}Ga_{0.84}As$ quantum well layer 58 having a thickness of 7 nm, an undoped $In_{0.13}Ga_{0.87}As_{0.75}P_{0.2}S$ first upper optical waveguide layer 59 having a thickness of 0.1 micrometers, an undoped AlGaAs electron barrier layer 60 having a thickness of 20 nm, a p-type $In_{0.13}Ga_{0.87}As_{0.75}P_{0.25}$ second upper optical waveguide layer 61 being doped with $7 \times 10^{17}$ cm$^{-1}$ Zn and having a thickness of 0.05 micrometers are formed in this order by MOCVD on an n-type GaAs substrate 51 which is doped with $2 \times 10^{18}$ cm$^{-3}$ Si.

Next, near-edge portions W (i.e., portions in vicinities of end facets) of the above layered structure are removed by photolithography and chemical etching, as explained below. First, stripe areas of the p-type $In_{0.13}Ga_{0.87}As_{0.75}P_{0.25}$ second upper optical waveguide layer 61, the undoped AlGaAs electron barrier layer 60, the undoped $In_{0.13}Ga_{0.87}As_{0.75}P_{0.25}$ first upper optical waveguide layer 59, the undoped $In_{0.16}Ga_{0.84}As$ quantum well layer 58, and the undoped $In_{0.13}Ga_{0.87}As_{0.75}P_{0.25}$ second lower optical waveguide layer 57 are etched off with a mixed solution of $H_2SO_4$, $H_2O_2$, and $H_2O$. Then, the remaining resist and the like are removed, and the wafer is washed. Finally, stripe areas of the undoped $In_{0.48}Ga_{0.52}P$ etching stop layer 56 are etched off with HCl.

Thereafter, in the second MOCVD stage, a p-type $In_{0.13}Ga_{0.87}As_{0.75}P_{0.25}$ third upper optical waveguide layer 62 being doped with $7 \times 10^{17}$ cm$^{-3}$ Zn and having a thickness of 0.3 micrometers, a p-type $In_{0.48}(Ga_{0.5}Al_{0.5})_{0.52}P$ upper cladding layer 63 being doped with $7 \times 10^{17}$ cm$^{-3}$ Zn and having a thickness of 2 micrometers, and a p-type GaAs cap layer 64 being doped with $2 \times 10^{19}$ cm$^{-3}$ Zn and having a thickness of 0.1 micrometers are formed in this order. Then, near-edge portions of the p-type GaAs cap layer 64 are selectively removed by etching with a mixed solution of $NH_4OH$ and $H_2O_2$, as illustrated in FIG. 3.

Next, a (Ti/Pt/Au) p electrode 65 is formed by evaporation and heat treatment, and the bottom surface of the n-type GaAs substrate 51 is polished until the total thickness of the layered structure becomes about 100 micrometers. Then, an (AuGe/Ni/Au) n electrode 66 is formed by evaporation and heat treatment.

Finally, laser bars are cut out, end facets are coated, and laser chips are cut out. Thus, the semiconductor laser device as the third embodiment is completed. The semiconductor laser device as the third embodiment oscillates at the wavelength of 980 nm.

Fourth Embodiment

Figure 4:
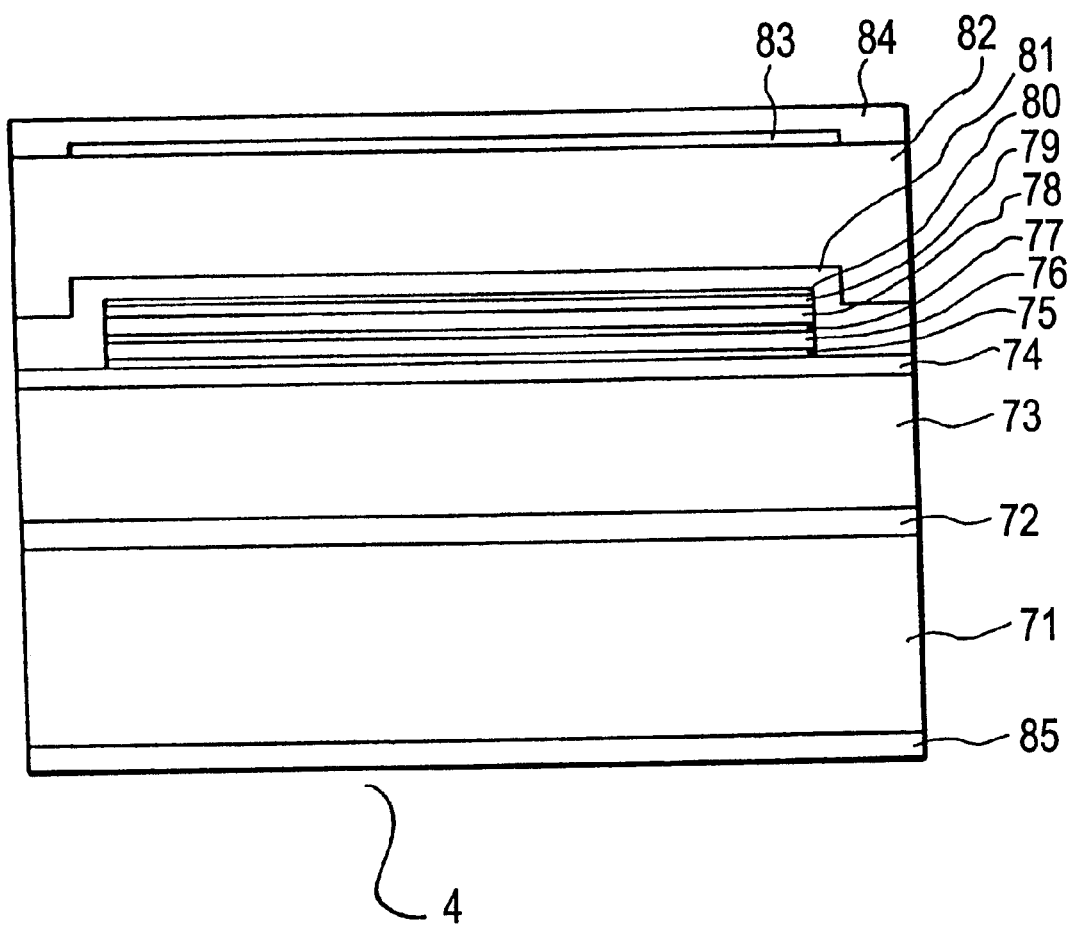
FIG. 4 is a cross-sectional view of a semiconductor laser device as the fourth embodiment of the present invention.

The construction of a semiconductor laser device 4 as the fourth embodiment of the present invention and a process of producing the construction are explained below with reference to FIG. 4, which is a cross-sectional view of the semiconductor laser device 4 as the fourth embodiment. FIG. 4 is a cross-sectional view illustrating a cross section parallel to a resonator axis of the semiconductor laser device. The semiconductor laser device as the fourth embodiment has the most simple full-face-electrode structure.

As illustrated in FIG. 4, in the first MOCVD stage, an n-type GaAs buffer layer 72 being doped with $5\times10^{17}$ cm$^{-3}$ Si and having a thickness of 0.5 micrometers, an n-type $In_{0.48}Ga_{0.52}P$ lower cladding layer 73 being doped with $5\times10^{17}$ cm$^{-3}$ Si and having a thickness of 1.5 micrometers, an n-type $In_{0.13}Ga_{0.87}As_{0.75}P_{0.25}$ first lower optical waveguide layer 74 being doped with $5\times10^{17}$ cm$^{-3}$ Si and having a thickness of 0.3 micrometers, an undoped $In_{0.48}Ga_{0.52}P$ etching stop layer 75 having a thickness of 20 nm, an undoped $In_{0.13}Ga_{0.87}As_{0.75}P_{0.25}$ second lower optical waveguide layer 76 having a thickness of 0.1 micrometers, an undoped $In_{0.13}Ga_{0.87}As$ quantum well layer 77 having a thickness of 6 nm, an undoped $In_{0.13}Ga_{0.87}As_{0.75}P_{0.25}$ first upper optical waveguide layer 78 having a thickness of 0.1 micrometers, an undoped $GaAs_{0.75}P_{0.25}$ electron barrier layer 79 having a thickness of 12 nm, a p-type $In_{0.13}Ga_{0.87}As_{0.75}P_{0.25}$ second upper optical waveguide layer 80 being doped with $7\times10^{17}$ cm$^{-3}$ Zn and having a thickness of 0.05 micrometers are formed in this order by MOCVD on an n-type GaAs substrate 71 which is doped with $2\times10^{18}$ cm$^{-3}$ Si.

Next, near-edge portions (i.e., portions in vicinities of end facets) of the above layered structure are removed by photolithography and chemical etching, as explained below. First, stripe areas of the p-type $In_{0.13}Ga_{0.87}As_{0.75}P_{0.25}$ second upper optical waveguide layer 80, the undoped $GaAs_{0.75}P_{0.25}$ electron barrier layer 79, the undoped $In_{0.13}Ga_{0.87}As_{0.75}P_{0.25}$ first upper optical waveguide layer 78, the undoped $In_{0.13}Ga_{0.87}As$ quantum well layer 77, and the undoped $In_{0.13}Ga_{0.87}As_{0.75}P_{0.25}$ second lower optical waveguide layer 76 are etched off with a mixed solution of $H_2SO_4$, $H_2O_2$, and $H_2O$. Then, the remaining resist and the like are removed, and the wafer is washed. Finally, stripe areas of the undoped $In_{0.48}Ga_{0.52}P$ etching stop layer 75 are etched off with HCl.

Thereafter, in the second MOCVD stage, a p-type $In_{0.13}Ga_{0.87}As_{0.75}P_{0.25}$ third upper optical waveguide layer 81 being doped with $7\times10^{17}$ cm$^{-3}$ Zn and having a thickness of 0.3 micrometers, a p-type $In_{0.48}Ga_{0.52}P$ upper cladding layer 82 being doped with $7\times10^{17}$ cm$^{-3}$ Zn and having a thickness of 2 micrometers, and a p-type GaAs cap layer 83 being doped with $2\times10^{19}$ cm$^{-3}$ Zn and having a thickness of 0.1 micrometers are formed in this order.

Next, near-edge portions of the p-type GaAs cap layer 83 are selectively removed by etching with a mixed solution of $NH_4OH$ and $H_2O_2$, as illustrated in FIG. 4. Thereafter, a (Ti/Pt/Au) p electrode 84 is formed by evaporation and heat treatment, and the bottom surface of the n-type GaAs substrate 71 is polished until the total thickness of the layered structure becomes about 100 micrometers. Then, an (AuGe/Ni/Au) n electrode 85 is formed by evaporation and heat treatment.

Finally, laser bars are cut out, end facets are coated, and laser chips are cut out. Thus, the semiconductor laser device as the fourth embodiment is completed. The semiconductor laser device as the fourth embodiment oscillates at the wavelength of 950 nm.

Fifth Embodiment

Figure 5A:
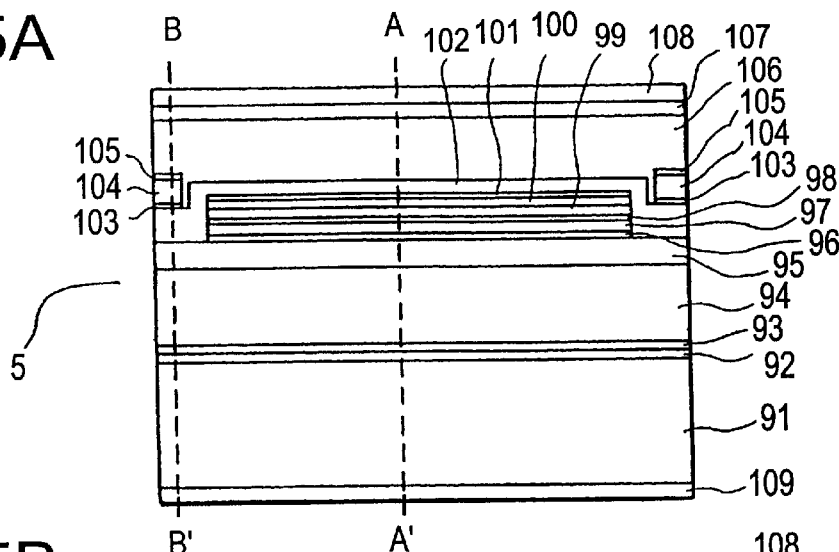
FIGS. 5A, 5B and 5C are cross-sectional views of a semiconductor laser device as the fifth embodiment of the present invention.
Figure 5B:
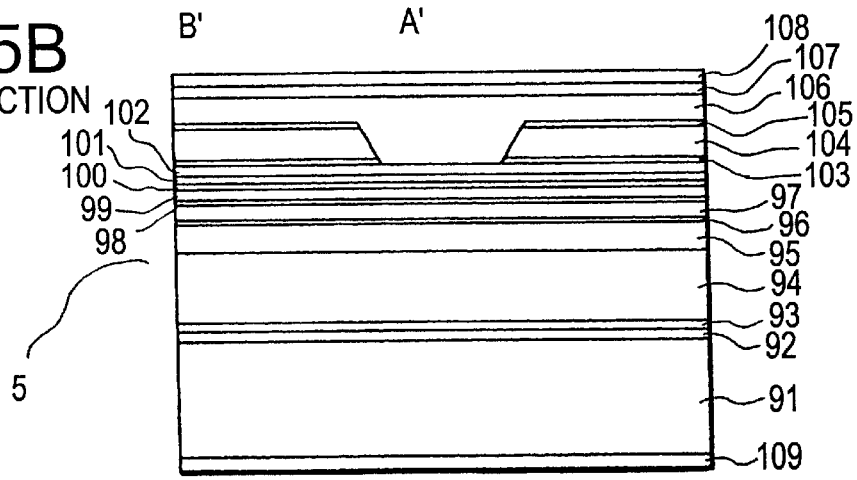
Figure 5C:
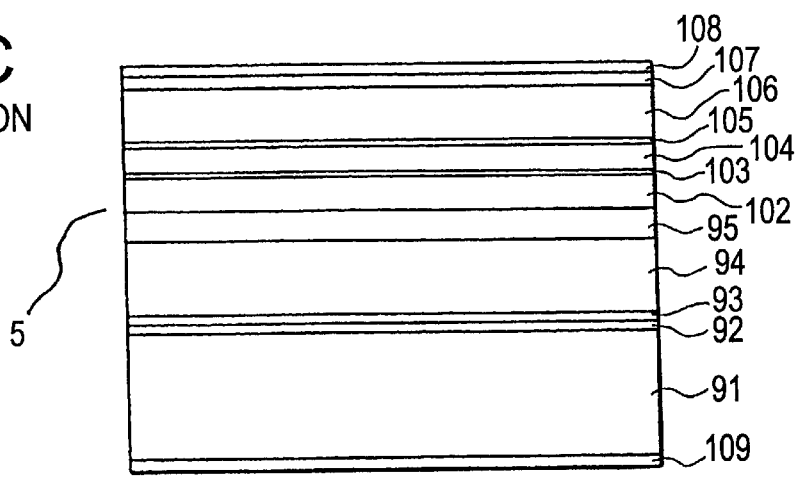

The construction of a semiconductor laser device 5 as the fifth embodiment of the present invention and a process of producing the construction are explained below with reference to FIGS. 5A to 5C, which are cross-sectional views of the semiconductor laser device 5 as the fifth embodiment. FIG. 5A is a first cross-sectional view illustrating a first cross section parallel to a resonator axis of the semiconductor laser device, FIG. 5B is a second cross-sectional view illustrating a second cross section (the A–A' cross section indicated in FIG. 5A), and FIG. 5C is a third cross-sectional view illustrating a third cross section (the B–B' cross section indicated in FIG. 5A).

As illustrated in FIG. 5A, in the first MOCVD (metal organic chemical vapor deposition) stage, an n-type GaAs buffer layer 92 being doped with $5\times10^{17}$ cm$^{-3}$ Si and having a thickness of 0.5 micrometers, an n-type $Al_xGa_{1-x}As$ graded buffer layer 93 being doped with $5\times10^{17}$ cm$^{-3}$ Si and having a thickness of 0.2 micrometers (where x gradually increases from 0.1 to 0.45), an n-type $Al_{0.45}Ga_{0.55}As$ lower cladding layer 94 being doped with $5\times10^{17}$ cm$^{-3}$ Si and having a thickness of 1.5 micrometers, an n-type $In_{0.13}Ga_{0.87}As_{0.75}P_{0.25}$ first lower optical waveguide layer 95 being doped with $5\times10^{17}$ cm$^{-3}$ Si and having a thickness of 0.4 micrometers, an undoped $In_{0.48}Ga_{0.52}P$ etching stop layer 96 having a thickness of 20 nm, an undoped $In_{0.13}Ga_{0.87}As_{0.75}P_{0.25}$ second lower optical waveguide layer 97 having a thickness of 0.1 micrometers, an undoped $In_{0.16}Ga_{0.84}As$ quantum well layer 98 having a thickness of 7 nm, an undoped $In_{0.13}Ga_{0.87}As_{0.75}P_{0.25}$ first upper optical waveguide layer 99 having a thickness of 0.1 micrometers, an undoped $Al_{0.5}Ga_{0.5}As$ electron barrier layer 100 having a thickness of 20 nm, a p-type $In_{0.13}Ga_{0.87}As_{0.75}P_{0.25}$ second upper optical waveguide layer 101 being doped with $7\times10^{17}$ cm$^{-3}$ Zn and having a thickness of 0.05 micrometers are formed in this order by reduced-pressure MOCVD on an n-type GaAs substrate 91 which is doped with $2\times10^{18}$ cm$^{-3}$ Si.

Next, near-edge portions (i.e., portions in vicinities of end facets) of the above layered structure are removed by photolithography and chemical etching, as explained below. First, stripe areas of the p-type $In_{0.13}Ga_{0.87}As_{0.75}P_{0.25}$ second upper optical waveguide layer 101, the undoped $Al_{0.5}Ga_{0.5}As$ electron barrier layer 100, the undoped $In_{0.13}Ga_{0.87}As_{0.75}P_{0.25}$ first upper optical waveguide layer 99, the undoped $In_{0.16}Ga_{0.84}As$ quantum well layer 98, and the undoped $In_{0.13}Ga_{0.87}As_{0.75}P_{0.25}$ second lower optical waveguide layer 97 are etched off with a mixed solution of $H_2SO_4$, $H_2O_2$, and $H_2O$. Then, the remaining resist and the like are removed, and the wafer is washed. Finally, stripe areas of the undoped $In_{0.48}Ga_{0.52}P$ etching stop layer 96 are etched off with HCl.

Thereafter, in the second MOCVD stage, a p-type $In_{0.13}Ga_{0.87}As_{0.75}P_{0.25}$ third upper optical waveguide layer 102 being doped with $7\times10^{17}$ cm$^{-3}$ Zn and having a thickness of 0.35 micrometers, an n-type $In_{0.48}Ga_{0.52}P$ etching stop layer 103 being doped with $1\times10^{18}$ cm$^{-3}$ Si and having a thickness of 10 nm, an n-type $Al_{0.55}Ga_{0.45}As$ current confinement layer 104 being doped with $1\times10^{18}$ cm$^{-3}$ Si and having a thickness of 0.8 micrometers, and an n-type GaAs cap layer 105 being doped with $1\times10^{18}$ cm$^{-3}$ Zn and having a thickness of 10 nm are formed in this order. Then, stripe areas of the n-type GaAs cap layer 105 and the n-type $Al_{0.55}Ga_{0.45}As$ current confinement layer 104, corresponding to a stripe oscillation region of the undoped $In_{0.16}Ga_{0.84}As$ quantum well layer 98, are removed by photolithography and etching with a mixed solution of $H_2SO_4$, $H_2O_2$, and $H_2O$. In addition, a stripe area of the n-type $In_{0.48}Ga_{0.52}P$ etching stop layer 103, corresponding to the stripe oscillation region of the undoped $In_{0.16}Ga_{0.84}As$ quantum well layer 98, is also removed by etching with HCl. As illustrated in FIG. 5B, the above stripe areas of the n-type GaAs cap layer 105, the n-type $Al_{0.55}Ga_{0.45}As$ current confinement layer 104, and the n-type $In_{0.48}Ga_{0.52}P$ etching stop layer 103 do not include near-edge portions (i.e., portions in vicinities of end facets) corresponding to the removal of the near-edge portions of the undoped $In_{0.16}Ga_{0.84}As$ quantum well layer 98. Thus, a current non-injection portions are formed in the vicinities of the end facets. As illustrated in FIG. 5C, the current injection portion does not appear on the end facet.

Thereafter, in the third MOCVD stage, a p-type $Al_{0.45}Ga_{0.55}As$ upper cladding layer 106 being doped with $7\times10^{17}$ cm$^{-3}$ Zn and having a thickness of 1.5 micrometers and a p-type GaAs cap layer 107 being doped with $2\times10^{19}$ cm$^{-3}$ Zn and having a thickness of 0.1 micrometers are formed in this order. Then, a (Ti/Pt/Au) p electrode 108 is formed by evaporation and heat treatment, and the bottom surface of the n-type GaAs substrate 91 is polished until the total thickness of the layered structure becomes about 100 micrometers. Then, an (AuGe/Ni/Au) n electrode 109 is formed by evaporation and heat treatment.

Finally, laser bars are cut out, end facets are coated, and laser chips are cut out. Thus, the semiconductor laser device as the fifth embodiment is completed. The semiconductor laser device as the fifth embodiment oscillates at the wavelength of 980 nm.

As illustrated in FIG. 5C, in the near-edge portions, the active region except for the n-type $In_{0.13}Ga_{0.87}As_{0.75}P_{0.25}$ first lower optical waveguide layer 95 is removed, and the p-type $In_{0.13}Ga_{0.87}As_{0.75}P_{0.25}$ third upper optical waveguide layer 102 is formed on the n-type $In_{0.13}Ga_{0.87}As_{0.75}P_{0.25}$ first lower optical waveguide layer 95. Therefore, a structure which is nonabsorbent of oscillation light is formed in the near-edge portions.

When the width of the stripe oscillation region is about 3 micrometers, the semiconductor laser device as the fifth embodiment can oscillate in a single transverse mode with high output power. Further, when the width of the stripe oscillation region is 50 micrometers, the semiconductor laser device as the fifth embodiment can oscillate with high output power of 5 W or more.

Sixth Embodiment

Figure 6A:
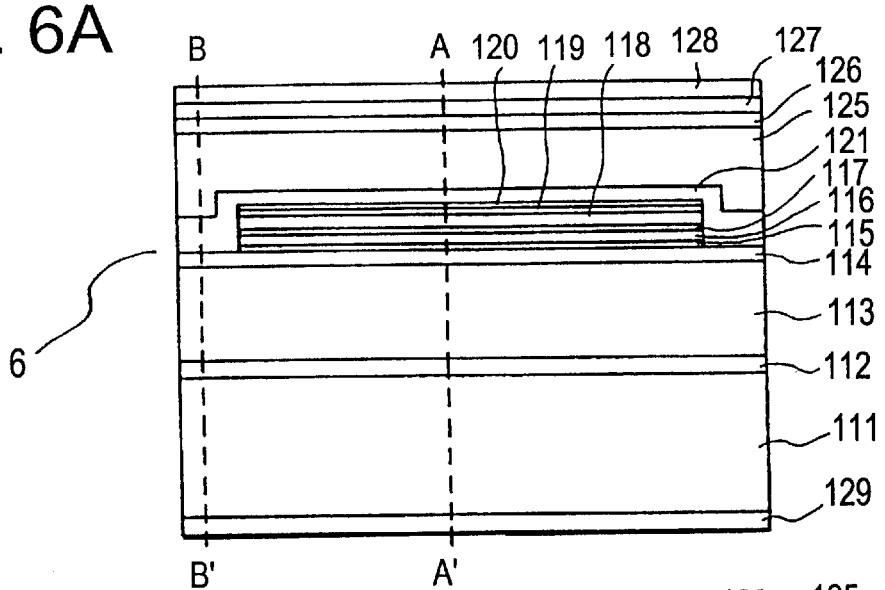
FIGS. 6A, 6B and 6C are cross-sectional views of a semiconductor laser device as the sixth embodiment of the present invention.
Figure 6B:
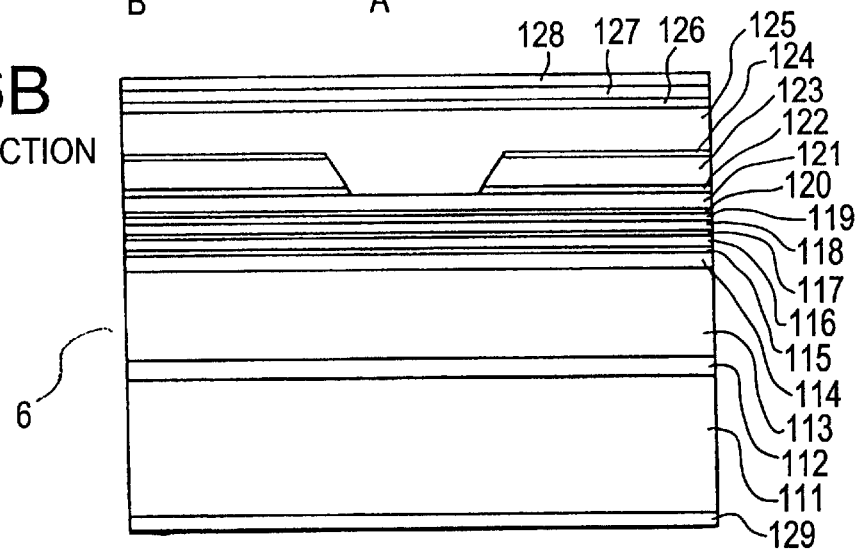
Figure 6C:
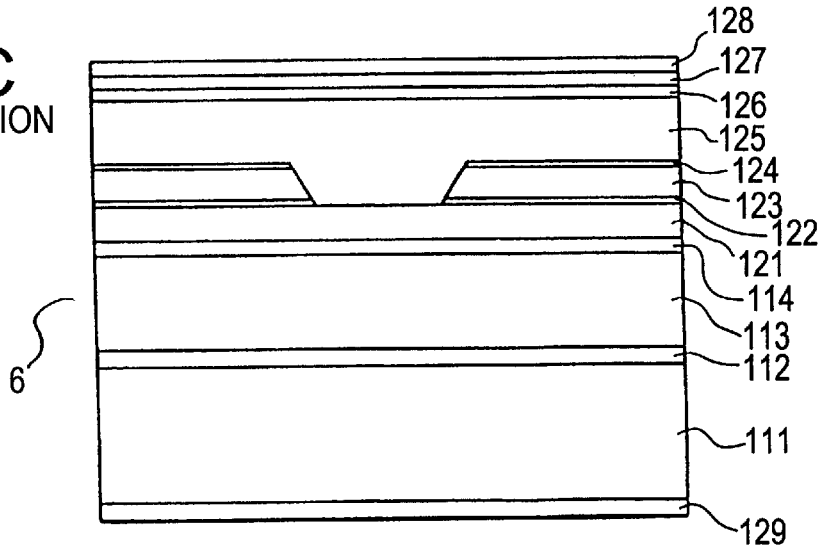

The construction of a semiconductor laser device 6 as the sixth embodiment of the present invention and a process of producing the construction are explained below with reference to FIGS. 6A to 6C, which are cross-sectional views of the semiconductor laser device 6 as the sixth embodiment. FIG. 6A is a first cross-sectional view illustrating a first cross section parallel to a resonator axis of the semiconductor laser device, FIG. 6B is a second cross-sectional view illustrating a second cross section (the A–A' cross section indicated in FIG. 6A), and FIG. 6C is a third cross-sectional view illustrating a third cross section (the B–B' cross section indicated in FIG. 6A).

As illustrated in FIG. 6A, in the first MOCVD stage, an n-type GaAs buffer layer 112 being doped with $5\times10^{17}$ cm$^{-3}$ Si and having a thickness of 0.5 micrometers, an n-type $In_{0.48}(Ga_{0.4}Al_{0.6})_{0.52}P$ lower cladding layer 113 being doped with $5\times10^{17}$ cm$^{-3}$ Si and having a thickness of 1.5 micrometers, an n-type $In_{0.48}Ga_{0.52}P$ first lower optical waveguide layer 114 being doped with $5\times10^{17}$ cm$^{-3}$ Si and having a thickness of 0.4 micrometers, an undoped $Al_{0.5}Ga_{0.5}As$ etching stop layer 115 having a thickness of 20 nm, an undoped $In_{0.48}Ga_{0.52}P$ second lower optical waveguide layer 116 having a thickness of 0.1 micrometers, an undoped $In_{0.13}Ga_{0.87}As_{0.75}P_{0.25}$ quantum well layer 117 having a thickness of 10 nm, an undoped $In_{0.48}Ga_{0.52}P$ first upper optical waveguide layer 118 having a thickness of 0.1 micrometers, an undoped $Al_{0.5}Ga_{0.5}As$ electron barrier layer 119 having a thickness of 20 nm, a p-type $In_{0.48}Ga_{0.52}P$ second upper optical waveguide layer 120 being doped with $7\times10^{17}$ cm$^{-3}$ Zn and having a thickness of 0.05 micrometers are formed in this order by reduced-pressure MOCVD on an n-type GaAs substrate 111 which is doped with $2\times10^{18}$ cm$^{-3}$ Si.

Next, near-edge portions (i.e., portions in vicinities of end facets) of the above layered structure are removed by photolithography and chemical etching alternately using HCl and a mixed solution of $H_2SO_4$, $H_2O_2$, and $H_2O$ as an etchant until near-edge portions of the n-type $In_{0.48}Ga_{0.52}P$ first lower optical waveguide layer 114 are exposed.

Thereafter, in the second MOCVD stage, a p-type $In_{0.48}Ga_{0.52}P$ third upper optical waveguide layer 121 being doped with $7\times10^{17}$ cm$^{-3}$ Zn and having a thickness of 0.35 micrometers, an n-type GaAs etching stop layer 122 being doped with $1\times10^{18}$ cm$^{-3}$ Si and having a thickness of 10 nm, an n-type $In_{0.48}(Ga_{0.6}Al_{0.4})_{0.52}P$ current confinement layer 123 being doped with $1\times10^{18}$ cm$^{-3}$ Si and having a thickness of 0.8 micrometers, and an n-type $In_{0.48}Ga_{0.52}P$ layer 124 being doped with $1\times10^{18}$ cm$^{-3}$ Zn and having a thickness of 10 nm are formed in this order. Then, stripe areas of the n-type $In_{0.48}Ga_{0.52}P$ layer 124 and the n-type $In_{0.48}(Ga_{0.6}Al_{0.4})_{0.52}P$ current confinement layer 123, corresponding to a stripe oscillation region of the undoped $In_{0.13}Ga_{0.87}As_{0.75}P_{0.25}$ quantum well layer 117, are removed by photolithography and etching with HCl. In addition, a stripe area of the n-type GaAs etching stop layer 122, corresponding to the stripe oscillation region of the undoped $In_{0.13}Ga_{0.87}As_{0.75}P_{0.25}$ quantum well layer 117, is removed by etching with a mixed solution of $NH_4OH$ and $H_2O_2$, as illustrated in FIGS. 6A and 6B.

Subsequently, in the third MOCVD stage, a p-type $In_{0.48}(Ga_{0.4}Al_{0.6})_{0.52}P$ upper cladding layer 125 being doped with $7\times10^{17}$ cm$^{-3}$ Zn and having a thickness of 1.5 micrometers and a p-type $In_{0.48}Ga_{0.52}P$ cap layer 126 being doped with $7\times10^{17}$ cm$^{-3}$ Zn and having a thickness of 0.1 micrometers are formed in this order. Next, a (Ti/Pt/Au) p electrode 128 is formed by evaporation and heat treatment, and the bottom surface of the n-type GaAs substrate 111 is polished until the total thickness of the layered structure becomes about 100 micrometers. Then, an (AuGe/Ni/Au) n electrode 129 is formed by evaporation and heat treatment.

Finally, laser bars are cut out, end facets are coated, and laser chips are cut out. Thus, the semiconductor laser device as the sixth embodiment is completed.

As illustrated in FIG. 6C, in the near-edge portions, the undoped $Al_{0.5}Ga_{0.5}As$ etching stop layer 115, the undoped $In_{0.48}Ga_{0.52}P$ second lower optical waveguide layer 116, the undoped $In_{0.13}Ga_{0.87}As_{0.75}P_{0.25}$ quantum well layer 117, the undoped $In_{0.48}Ga_{0.52}P$ first upper optical waveguide layer 118, the undoped $Al_{0.5}Ga_{0.5}As$ electron barrier layer 119, and the p-type $In_{0.48}Ga_{0.52}P$ second upper optical waveguide layer 120 are removed, and the p-type $In_{0.48}Ga_{0.52}P$ third upper optical waveguide layer 121 is formed on the n-type $In_{0.48}Ga_{0.52}P$ first lower optical waveguide layer 114. Therefore, a structure which is nonabsorbent of oscillation light is formed in the near-edge portions.

The semiconductor laser device as the sixth embodiment oscillates at the wavelength of 810 nm.

Additional Matters (i) For similar reasons to the first embodiment, the performance and reliability of the semiconductor laser devices as the second to sixth embodiments are improved.

(ii) The present invention is not limited to the semiconductor laser devices as the first to sixth embodiments, and can be applied to every type of semiconductor laser device having any construction and composition. When the semiconductor laser devices have the features of the present invention, the characteristics and reliability of the semiconductor laser devices are improved for similar reasons to the first embodiment.

(iii) Since the semiconductor laser device according to the present invention comprises, in vicinities of end facets, a reliable window structure which is nonabsorbent to oscillation light, the semiconductor laser device according to the present invention can be used as a light source in the fields of high-speed, information processing, image processing, communications, measurement, medicine, printing, and the like.

What is claimed is:

1. A semiconductor laser device comprising:

a substrate;

an active region formed above said substrate; and a non-absorbing layer formed over said active region, and made of a semiconductor material having a bandgap greater than photon energy of laser light which oscillates in said semiconductor laser device;

said active region includes, a first lower optical waveguide layer formed above said substrate, an etching stop layer formed on said first lower optical waveguide layer except for near-edge areas of said first lower optical waveguide layer which are adjacent to opposite end facets of said semiconductor laser device, where said opposite end facets are perpendicular to a direction of said laser light, a second lower optical waveguide layer formed on said etching stop layer, a quantum well active layer formed on said second lower optical waveguide layer, a first upper optical waveguide layer formed on said quantum well active layer, an electron barrier layer formed on said first upper optical waveguide layer and made of a semiconductor material having a bandgap greater than a bandgap of said first upper optical waveguide layer, and a second upper optical waveguide layer formed on said electron barrier layer;

said etching stop layer has such a chemical property that said etching stop layer can be maintained when said second lower optical waveguide layer, said quantum well active layer, said first upper optical waveguide layer, and said electron barrier layer are etched, and said first lower optical waveguide layer can be maintained when the etching stop layer is etched.

2. A semiconductor laser device according to claim 1, wherein said quantum well active layer is made of an aluminum-free semiconductor material.

3. A semiconductor laser device according to claim 1, wherein said non-absorbing layer and a semiconductor layer immediately under said non-absorbing layer are made of an aluminum-free semiconductor material.

* * * * *